United States Patent
Shi et al.

(10) Patent No.: US 8,648,609 B2
(45) Date of Patent: Feb. 11, 2014

(54) TESTING SYSTEM AND ADAPTER THEREOF UTILIZING A COMMON POWER SUPPLY AND DISPLAY DEVICE TO TEST DIFFERENT MAIN BOARD CIRCUITS

(75) Inventors: Kai-Fu Shi, Taipei (TW); Zhen-Wu Xu, Taipei (TW)

(73) Assignee: Wistron Corporation, Taipei Hsien (TW)

( * ) Notice: Subject to any disclaimer, the term of this patent is extended or adjusted under 35 U.S.C. 154(b) by 824 days.

(21) Appl. No.: 12/879,614

(22) Filed: Sep. 10, 2010

(65) Prior Publication Data

US 2011/0109322 A1    May 12, 2011

(30) Foreign Application Priority Data

Nov. 9, 2009  (CN) .......................... 2009 1 0180155

(51) Int. Cl.
*H01H 31/02* (2006.01)
*G01R 31/02* (2006.01)
(52) U.S. Cl.
CPC .................................. *G01R 31/021* (2013.01)
USPC ........................................................ 324/555
(58) Field of Classification Search
None
See application file for complete search history.

(56) References Cited

U.S. PATENT DOCUMENTS

| 4,462,069 A | 7/1984 | Becky |
| 2007/0296055 A1 | 12/2007 | Yen et al. |
| 2008/0088550 A1 * | 4/2008 | Kim et al. .................. 345/82 |

FOREIGN PATENT DOCUMENTS

| CN | 2890920 Y | 4/2007 |
| CN | 101089678 A | 12/2007 |
| TW | 270675 | 2/1996 |
| TW | 200802781 A | 1/2008 |
| TW | 200803461 A | 1/2008 |
| TW | 200931785 A | 7/2009 |

OTHER PUBLICATIONS

Chinese Office Action, counterpart CN200910180155.7, dated Jun. 27, 2012.
Tawianese Office Action, counterpart application No. 098137918, dated Jan. 7, 2013.

* cited by examiner

*Primary Examiner* — Paresh Patel
(74) *Attorney, Agent, or Firm* — Steptoe & Johnson LLP

(57) ABSTRACT

A testing system utilizing a common power supply and a display device to test different types of a main board circuit is disclosed. The testing system includes a power supply device for outputting a predetermined power; a liquid crystal display for receiving a control signal from the main board circuit to perform a testing procedure; and an adapter. The adapter includes a first circuit coupled electrically between the power supply device and the main board circuit for converting the predetermined power into a power needed by the main board circuit, and a second circuit coupled electrically between the main board circuit and the liquid crystal display for converting a control signal generated by the main board circuit into a signal format required to perform the testing procedure on the liquid crystal display.

19 Claims, 11 Drawing Sheets

TESTING SYSTEM AND ADAPTER THEREOF UTILIZING A COMMON POWER SUPPLY AND DISPLAY DEVICE TO TEST DIFFERENT MAIN BOARD CIRCUITS

CROSS-REFERENCE TO RELATED APPLICATION

This application claims priority of Chinese Application No. 200910180155.7, filed on Nov. 9, 2009, the disclosure of which is hereby incorporated by reference.

BACKGROUND OF THE INVENTION

1. Field of the Invention

The present invention relates to a testing system and to an adapter thereof for testing components of a liquid crystal display, more particularly, to a testing system and to an adapter thereof for testing different types of main board circuits of a liquid crystal display.

2. Description of the Related Art

Referring to FIG. 1, at present, when performing a test on, for example, a main board circuit 90 of a liquid crystal display television (LCD TV) on an assembly line, a power board 91, an LCD panel 92, and connecting wires 901~903 for use in the testing are typically selected corresponding to the model type of the LCD TV (used interchangeably with "LCD" herein). However, when the model type of the main board circuit 90 is changed, the testing equipment (i.e., the power board 91, the LCD panel 92, and the connecting wires 901~903) also needs to be changed. As a result, the current testing method involves high costs as follows:

1. Machinery Costs

During testing of a main board circuit 90 of a particular machine model, it is necessary to use a power board 91 and LCD panel 92 designed for the particular machine model, and a different power board 91 and LCD panel 92 are required for a main board circuit 90 of a different machine model. Therefore, it is necessary to purchase differently sized power boards 91 and LCD panels 92 from different suppliers, thereby making it difficult to minimize costs associated with testing. This is particularly the case in view of the fact that the LCD panel 92 is an expensive piece of equipment.

2. Manpower and Time Costs

When the main board 90 of the machine model is changed in an assembly line, the LCD panel 92 must also be changed to one that is suitable for the changed machine model. This requires manpower and time.

3. Panel Maintenance Costs

Since the LCD panel 92 is not specially made for testing, it easily malfunctions after long periods of use, thereby making repair necessary. Hence, the LCD panel 92 is associated with high maintenance costs.

4. Connecting Wire Replacement Costs

The connecting wires 903 connecting the main board circuit 90 and the LCD panel 92 are special, low-voltage differential signaling (LVDS) cables. Since the connecting wires 903 are used for a testing purpose in the assembly line, it is necessary to perform at least one unplug and plug operation for each main board circuit 90 after the first that is tested. Hence, the connecting wires 903 become worn over time and must be replaced, leading to increased maintenance costs for the testing equipment.

SUMMARY OF THE INVENTION

Therefore, the object of the present invention is to provide a testing system and an adapter thereof that utilize a common power supply and display device to test main board circuits of different model types without the need to change testing equipment so as to reduce testing costs.

According to one aspect, the testing system of this invention utilizes a common power supply and a display device to test different types of a main board circuit, and comprises: a power supply device for outputting a predetermined power; a liquid crystal display for receiving a control signal from the main board circuit to perform a testing procedure; and an adapter. The adapter includes a first circuit coupled electrically between the power supply device and the main board circuit for converting the predetermined power into a power needed by the main board circuit, and a second circuit coupled electrically between the main board circuit and the liquid crystal display for converting a control signal generated by the main board circuit into a signal format required to perform the testing procedure on the liquid crystal display.

According to another aspect, the adapter of this invention utilizes a common power supply device and a display device to test different types of a main board circuit, and comprises: a first circuit coupled electrically between the power supply device and the main board circuit to be tested, for converting a predetermined power generated by the power supply device into a power needed by the main board circuit; and a second circuit coupled electrically between the main board circuit and the display device, for converting a control signal generated by the main board circuit into a signal format required to perform the testing procedure on the display device.

In the present invention, by sharing power and display for detecting the equipment of different main board circuits and switching devices, testing costs of main board circuits are reduced and the efficiency of testing main board circuits in an assembly line is increased due to the fact that it is unnecessary to replace different mating components when testing main board circuits of different machine models.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

I. System Architecture

Figure 1:
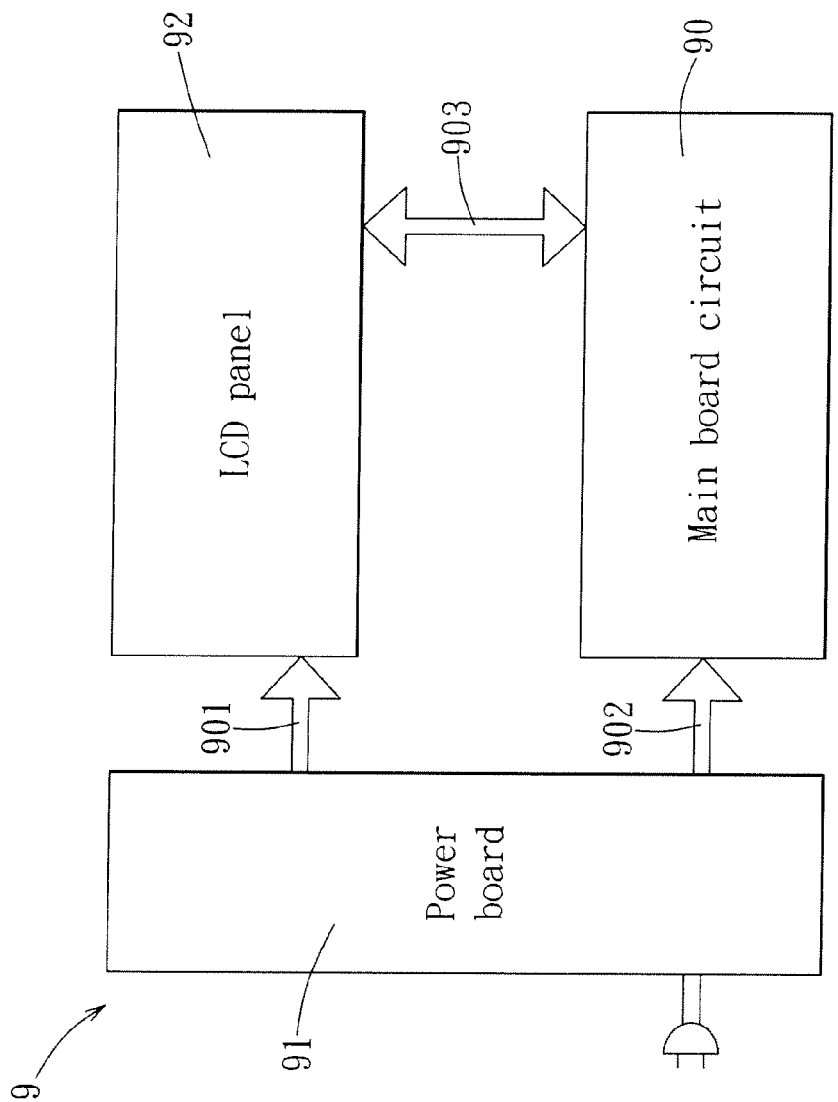
FIG. 1 is a schematic circuit block diagram illustrating a conventional testing system for a main board circuit of a liquid crystal display in an assembly line.
Figure 2:
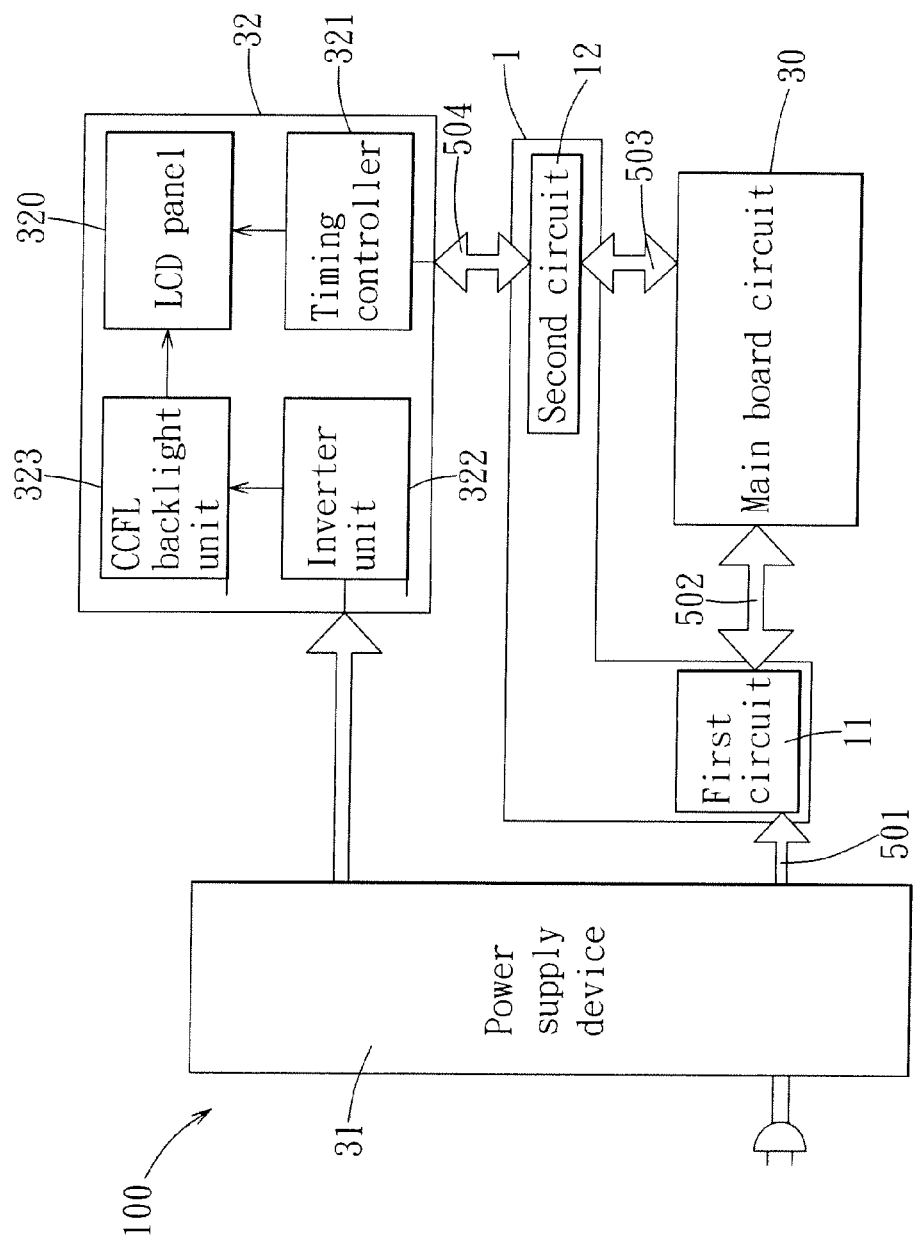
FIG. 2 is a schematic circuit block diagram of a testing system utilizing a common power supply and display device to test different main board circuits according to a preferred embodiment of the present invention, in which the testing system includes a first circuit and a second circuit.

Referring to FIG. 2, a testing system 100 according to a preferred embodiment of the present invention is used for testing a main board circuit 30 of an LCD TV. The testing system 100 includes a power supply device 31, a liquid crystal display 32, and an adapter 1 coupled electrically to the main board circuit 30, the power supply device 31, and the liquid crystal display 32.

The purpose of this invention is to provide a testing system 100 for testing main board circuits 30 of different machine models, such that each time the machine model of the main board circuit 30 to be tested is changed, testing equipment, including the power supply device 31 and the liquid crystal display 32, and connecting wires 501, 504 for connecting the adapter 1 do not need to be plugged and unplugged or changed, and it is necessary only to change the two connecting wires 502, 503 interconnecting the adapter 1 and the main board circuit 30.

The liquid crystal display 32 includes an LCD panel 320, a timing controller (also referred to as a T-CON BOARD) 321, an inverter unit 322, and a CCFL (cold cathode fluorescent lamp) backlight unit 323. The liquid crystal display 32 functions primarily to receive low-voltage differential signaling (LVDS) signals of the main board circuit 30 and display corresponding images. The power supply device 31 is used to output power for use by the adapter 1 and to provide a voltage of 24V for the inverter unit 322 of the liquid crystal display 32.

The adapter 1 includes a first circuit 11 and a second circuit 12. The first circuit 11 is coupled electrically to the power supply device 31 and the main board circuit 30. The first circuit 11 receives a predetermined power through the connecting wire 501, converts the predetermined power into a power needed by the main board circuit 30, and then transmits the converted power to the main board circuit 30 via the connecting wire 502. The second circuit 12 is coupled electrically to the main board circuit 30 and the liquid crystal display 32. The second circuit 12 receives a control signal generated by the main board circuit 30 via the connecting wire 503, converts the control signal into a control and image signal needed to perform a testing procedure using the liquid crystal display 32, and then transmits the converted control and image signal to the liquid crystal display 32 via the connecting wire 504.

The operating principles of the present invention are outlined in the following by separately describing the first circuit 11 and the second circuit 12 of the adaptor 1. FIGS. 3 to 7 relate to the first circuit 11, and FIGS. 8 to 10 relate to the second circuit 12.

II. First Circuit 11

Referring to FIG. 2, as described above, the first circuit 11 receives a predetermined power through the connecting wire 501, converts the predetermined power into a power needed by the main board circuit 30, and transmits the converted power to main board circuit 30 via the connecting wire 502. Through such conversion, the first circuit 11 is able to generate various regulated output voltages suitable for main board circuits 30 of different machine models.

In this embodiment, the first circuit 11 includes a plurality of power pins and a pair of control pins coupled electrically to the main board circuit 30. The power requirements of the power pins include voltages of 15V, 12V, 5V and 3.3V. A first control pin PS_ONA is a high level system on or a low level system on. A second control pin AC_drop_D has power requirements of 3.3V+, 3.3V−, and 12V+.

Figure 3:
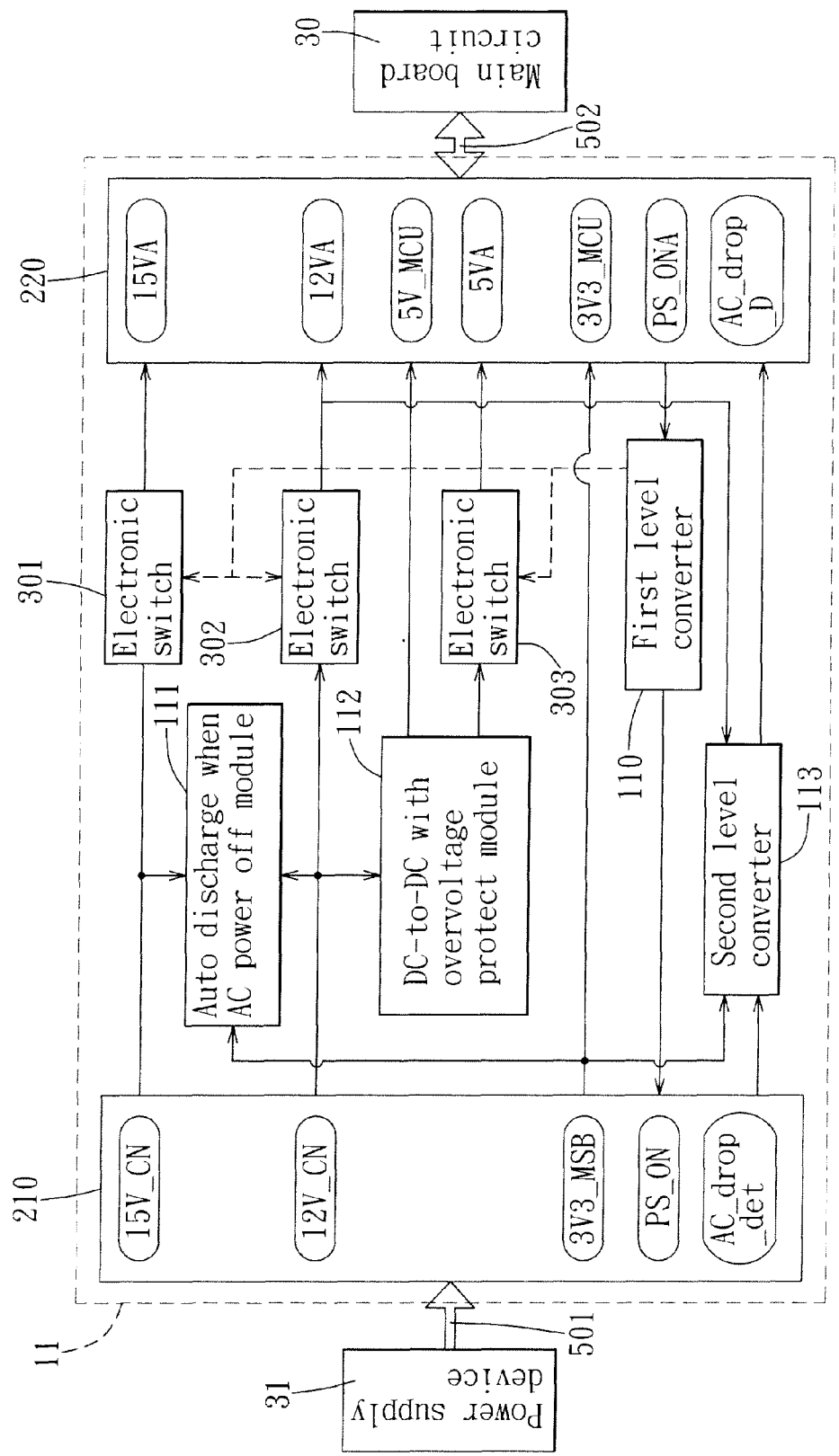
FIG. 3 is a schematic circuit block diagram of the first circuit of the preferred embodiment.

With reference to FIG. 3, the first circuit 11 includes a first input port 210, a first output port 220, an auto discharge when AC power off module 111, a DC-to-DC with overvoltage protect module 112, a first level converter 110, a second level converter 113, and three electronic switches 301~303.

The connecting wire 502, which interconnects the first circuit 11 and the main board circuit 30, can be designed according to the power requirements of the main board circuit 30. That is, a selection is made from the first output port 220 of the first circuit 11, and, at the same time, the pin definition of the main board circuit 30 is considered to thereby design a suitable connecting wire.

The first input port 210 of the first circuit 11 is coupled electrically to the power supply device 31 and includes five pins as follows: 15V_CN, 12V_CN, 3V3_MSB, PS_ON, and AC_drop_det. The first output port 220 of the first circuit 11 is coupled electrically to the main board circuit 30 and includes seven pins as follows: 15VA, 12VA, 5V_MCU, 5VA, 3V3_MCU, PS_ONA, and AC_drop_D. The pins PS_ONA and AC_drop_det are control pins, while the rest are power pins.

When a microprocessor (not shown) of the main board circuit 30 requires a voltage of 5V, the power of the third pin 5V_MCU and that of the fourth pin 5VA are obtained as follows: the DC-to-DC with overvoltage protect module 112 converts a first voltage of 12V from the pin 12V_CN of the first input port 210 into a second voltage of 5V for the third pin 5V_MCU, and at the same time, the first control pin PS_ONA controls the first level converter 110 to convert the voltage level and subsequently controls the electronic switch 303 to generate power for the fourth pin 5VA. When the main board circuit 30 requires a voltage of 3.3V, the power of the fifth pin 3V3_MCU is directly obtained from the pin 3V3_MSB.

Since the power supply device 31 does not provide a voltage of 5V, the manner in which the DC-to-DC with overvoltage protect module 112 uses a voltage of 12V provided by the power supply device 31 to generate a voltage of 5V is described below.

Figure 4A:
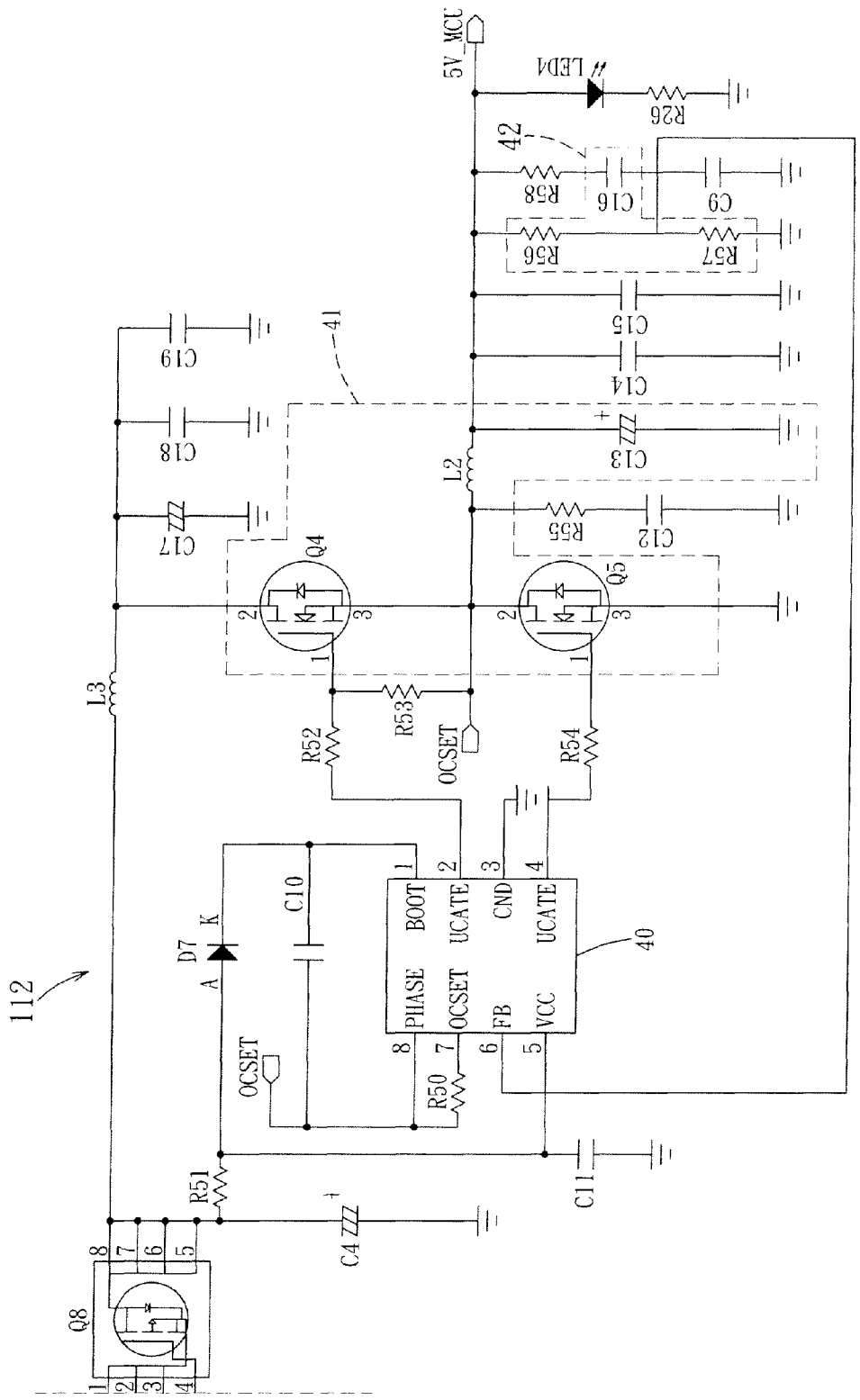
FIG. 4A is a circuit diagram of a DC-to-DC with overvoltage protect module of the first circuit of the preferred embodiment, in which the section to the left of the dotted line indicates a DC-to-DC converting portion thereof.
Figure 4B:
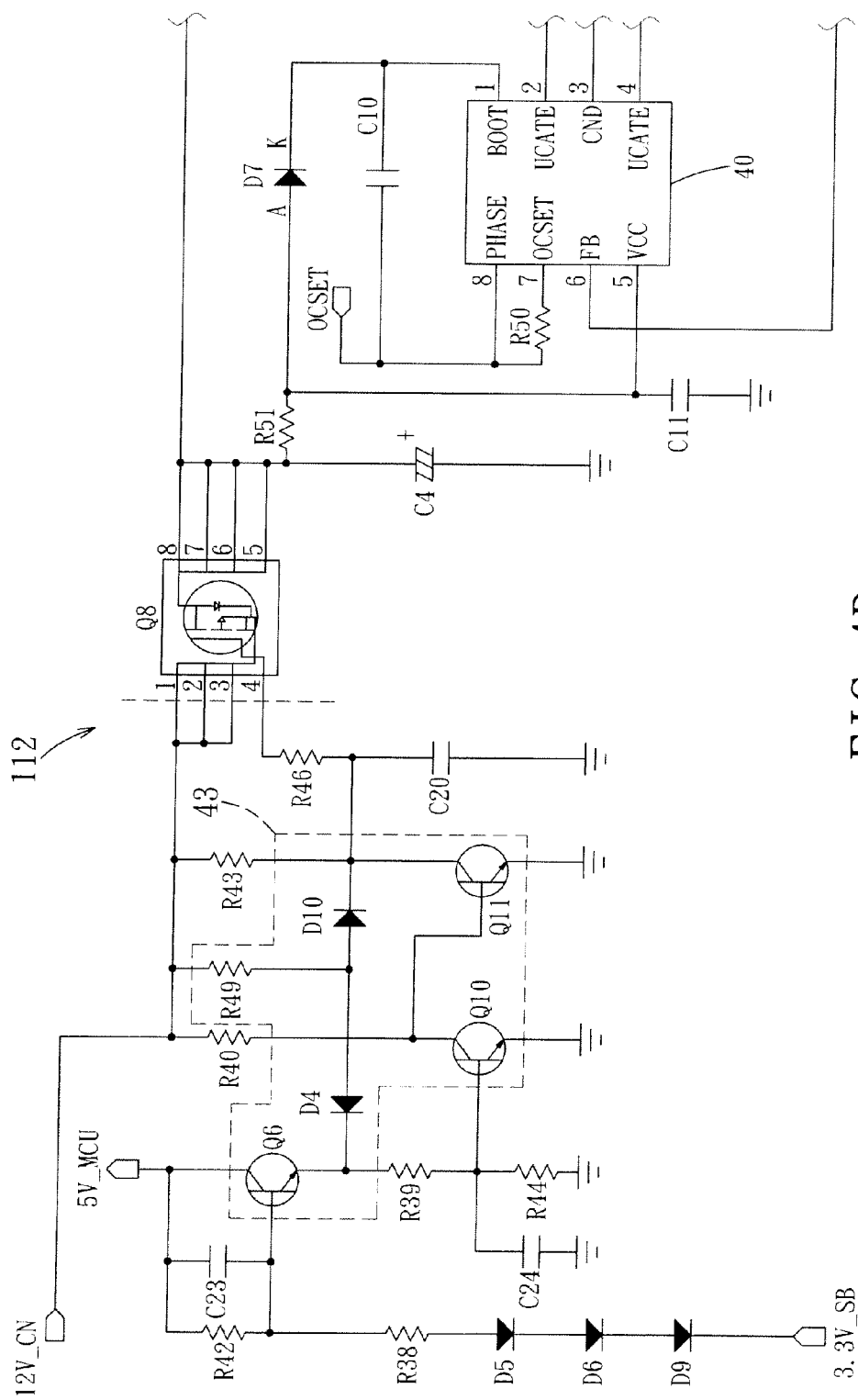
FIG. 4B is a circuit diagram of the DC-to-DC with overvoltage protect module of the first circuit of the preferred embodiment, in which the section to the right of the dotted line indicates an overvoltage protection portion thereof.

Referring to FIGS. 4A and 4B, the DC-to-DC with overvoltage protect module 112 is divided by a dotted line into a right-half region as a DC-to-DC conversion portion (FIG. 4A), and a left-half region as an overvoltage protection portion (FIG. 4B). The operation of each of these portions is detailed below.

Referring to FIG. 4A, the DC-to-DC conversion portion of the DC-to-DC with overvoltage protect module 112 includes components such as a plurality of transistors Q8, Q4, Q5, a pulse width modulation (PWM) controller 40 (Model No. APM7120), etc. The transistor Q8 is an input end for receiving the voltage of 12V from the pin 12V_CN (see FIG. 3). The PWM controller 40 is used to control output of a PWM power to pass through a switch filter circuit 41 formed of transistors Q4, Q5, an inductor L2, a capacitor C13, etc., for outputting a voltage of 5V to the pin 5V_MCU (see FIG. 3). The components of resistors R56, R57 and a capacitor C16 are used to form a voltage feedback network 42, in which component parameters of the voltage feedback network 42 are used to determine the output voltage of the PWM controller 40.

Referring to FIG. 4B, in the overvoltage protection portion of the DC-to-DC with overvoltage protect module 112, the input voltage is selected from the pin 3.3V_MSB (see FIG. 3), and when the voltage output from the pin 5V_MCU is higher than a predetermined voltage, for example, 5.4 volts, the transistor Q6 conducts, after which inversion takes place through the transistor Q10 to cause the transistors Q11 and Q8 to cut off so as to shut off the power supplied by the PWM controller 40. As a result, the output of the pin 5V_MCU is reduced to 0V, thereby protecting the load circuit that provides the voltage of 5V.

During normal operation, when the pin 12V_CN is on, the transistor Q11 is maintained in a conducting state as a result of a resistor R40, and hence, the transistor Q8 is immediately conducted, such that the DC-to-DC with overvoltage protect module 112 provides power. Moreover, the transistors Q6, Q10, Q11, two diodes D4, D10, and the resistor R49 form a single-trigger self-lock circuit 43, and once the voltage of the pin 5V_MCU is abnormally increased, the transistor Q6 is instantly caused to conduct, the C terminal of the transistor Q6 is at a high level, the C terminal of the transistor Q10 is at a low level, the C terminal of the transistor Q11 is at a high level, the diode D10 is cut off, the voltage of the pin 12V_CN passes through the resistor R49, and the diode D4 continues to maintain the high voltage of the resistor R39, such that the C terminal of the transistor Q6 is at a high level so as to ensure that the transistor Q11 is kept in the cut off state. The only way to unlock this state is to shut down and re-start the testing system 100.

Referring again to FIG. 3, with respect to the main board circuit 30 of a different machine model, the level of the system-on voltage generated by the first control pin PS_ONA is different, and the first level converter 110 is used to convert the voltage level of the first control pin PS_ONA and to control the on and off states of the electronic switches 301~303.

When the main board circuit 30 requires a voltage of 15V or 12V, from the point of view of the first output port 220, the input voltages of the first pin 15VA and the second pin 12VA utilize the power from the pins 15V_VN and 12V_CN, and after control by the first control pin PS_ONA for voltage level conversion through the first level converter 110, the electronic switches 301~302 are controlled to thereby generate the voltages.

Figure 5:
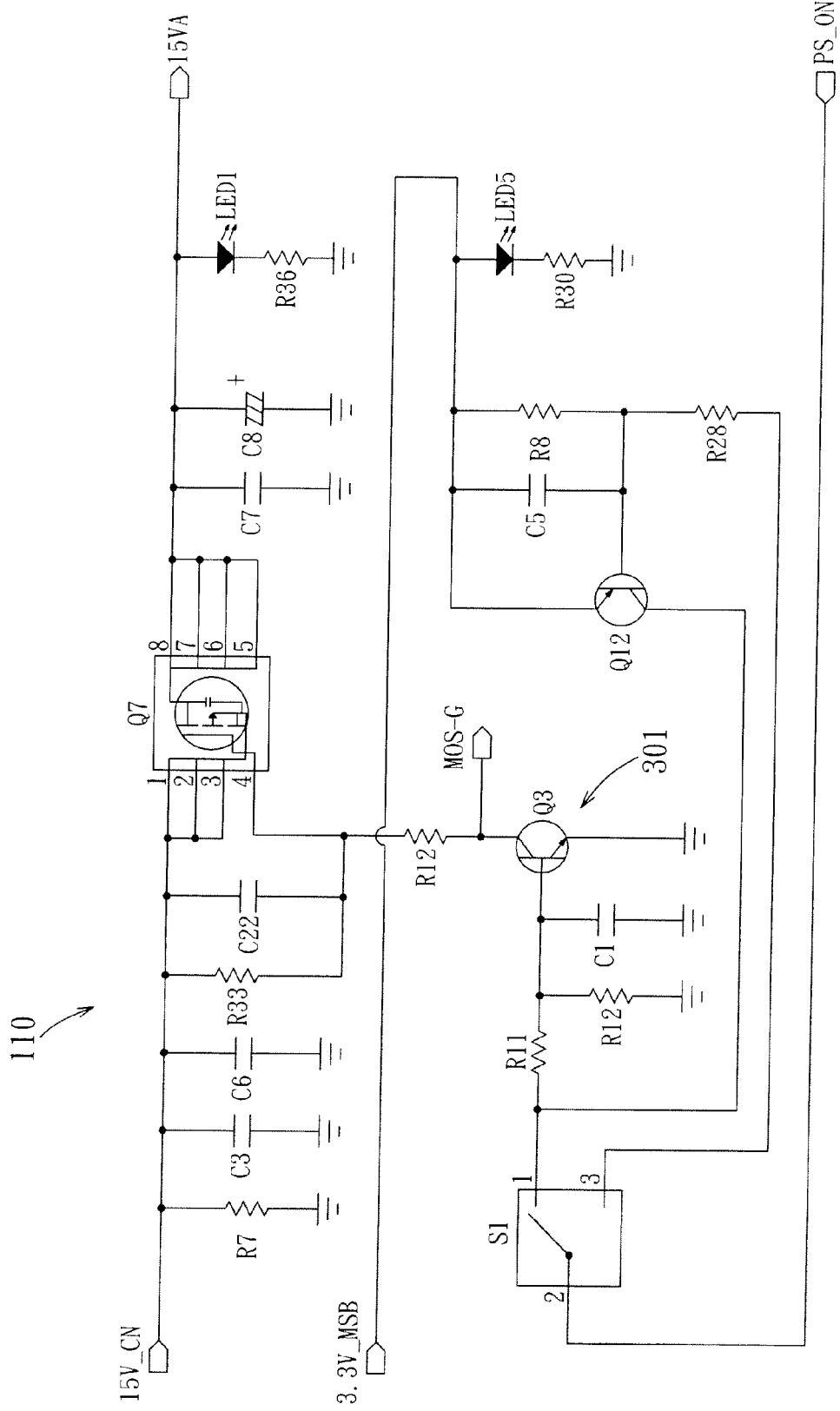
FIG. 5 is a circuit diagram of a first level converter of the preferred embodiment.

Referring to FIG. 5, the first level converter 110 is a voltage level selection circuit controlled by the first control pin PS_ONA, and the electronic switch 301 connected to one of the pins (the pin 15VA) is a transistor Q3. Since the control principles of the other two pins (pin 12VA and pin 5VA) are similar, in the following, there is described only the manner in which the voltage of 15V required by the pin 15VA is generated.

A switch unit S1 selects the voltage level for the first control pin PS_ONA, in which selection of 1 results in a high voltage level for turning the system on and selection of 3 results in a low level for turning the system on. The transistor Q3 is the electronic switch 301 connected to the pin 15VA for providing control signals for the transistor Q7. When the transistor Q3 is cut off, the transistor Q7 is cut off, and when transistor Q3 conducts, the transistor Q7 also conducts, and a voltage of 15V is output to the pin 15VA, and at the same time, LED1 is turned on.

Referring again to FIG. 3, the power supply device 31 can only generate an AC_drop_det signal. However, the main board circuits 30 to be tested may require three kinds of AC_drop_D signals, which are 3.3V+, 3.3V− and 12V+, respectively. Therefore, in this embodiment, a "level conversion" concept is used to convert one signal into three different signals to allow for testing of various different main board circuits 30.

Therefore, after converting a predetermined voltage from the second control pin AC_drop_det of the first input port 210, the second level converter 113 outputs control signals including 3.3V+, 3.3V− and 12V+ to the second control pin AC_drop_D of the first output port 220.

Figure 6:
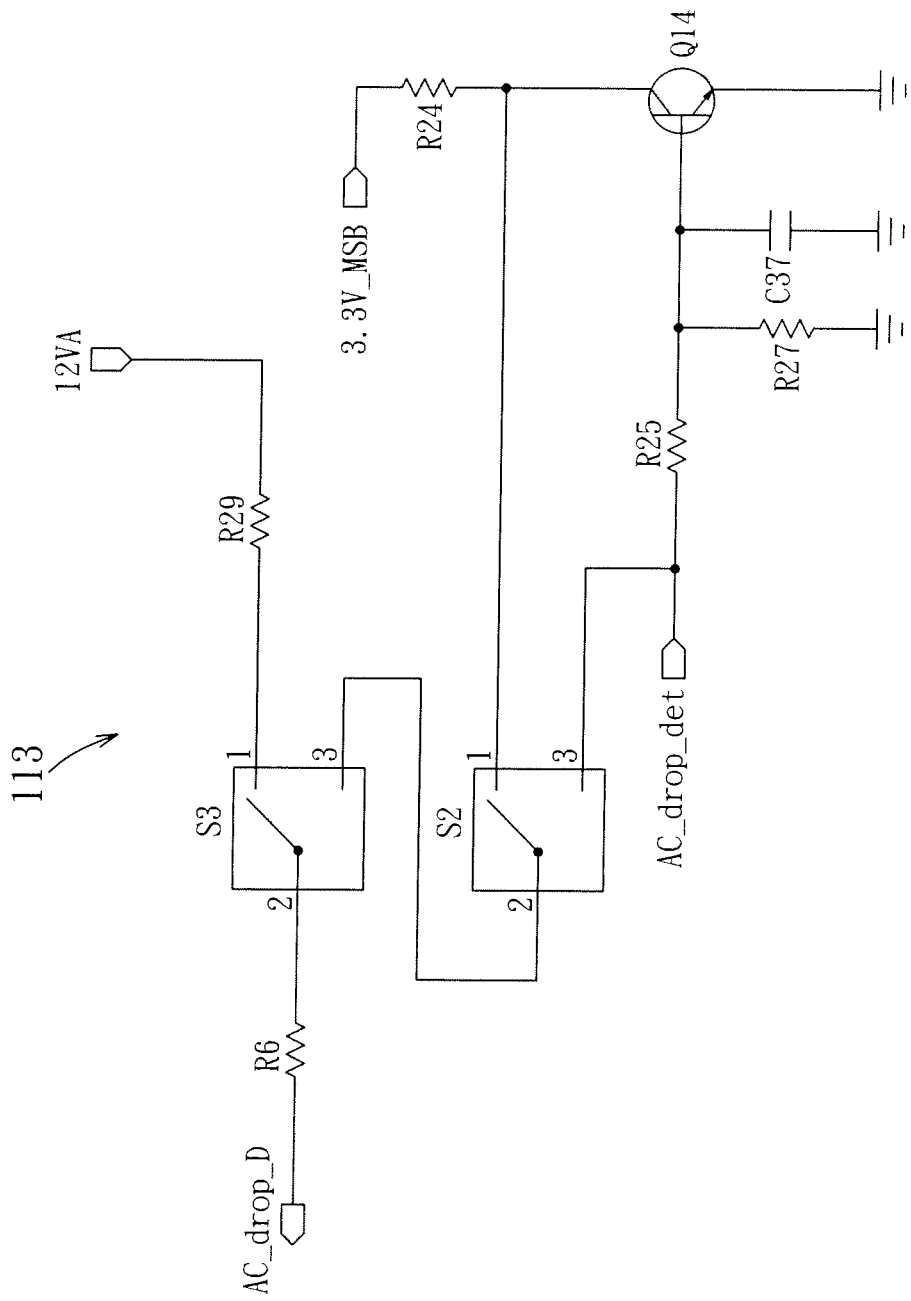
FIG. 6 is a circuit diagram of a second level converter of the preferred embodiment.

Referring to FIG. 6, the second level converter 113 includes a control pin AC_drop_det (the power supply end) for receiving input from the power supply device 31, and uses the input pins 12VA, 3.3V_MSB, electronic switches S2, S3 for voltage level selection switches. The second level converter 113 further cooperates with transistor Q14 to realize signal inversion, after which output from the output control pin AC_drop_D (the main board circuit end) to the main board circuit 30 is performed. In this manner, the second level converter 113 outputs three voltage levels including 3.3V+, 3.3V− and 12V+.

Figure 7:
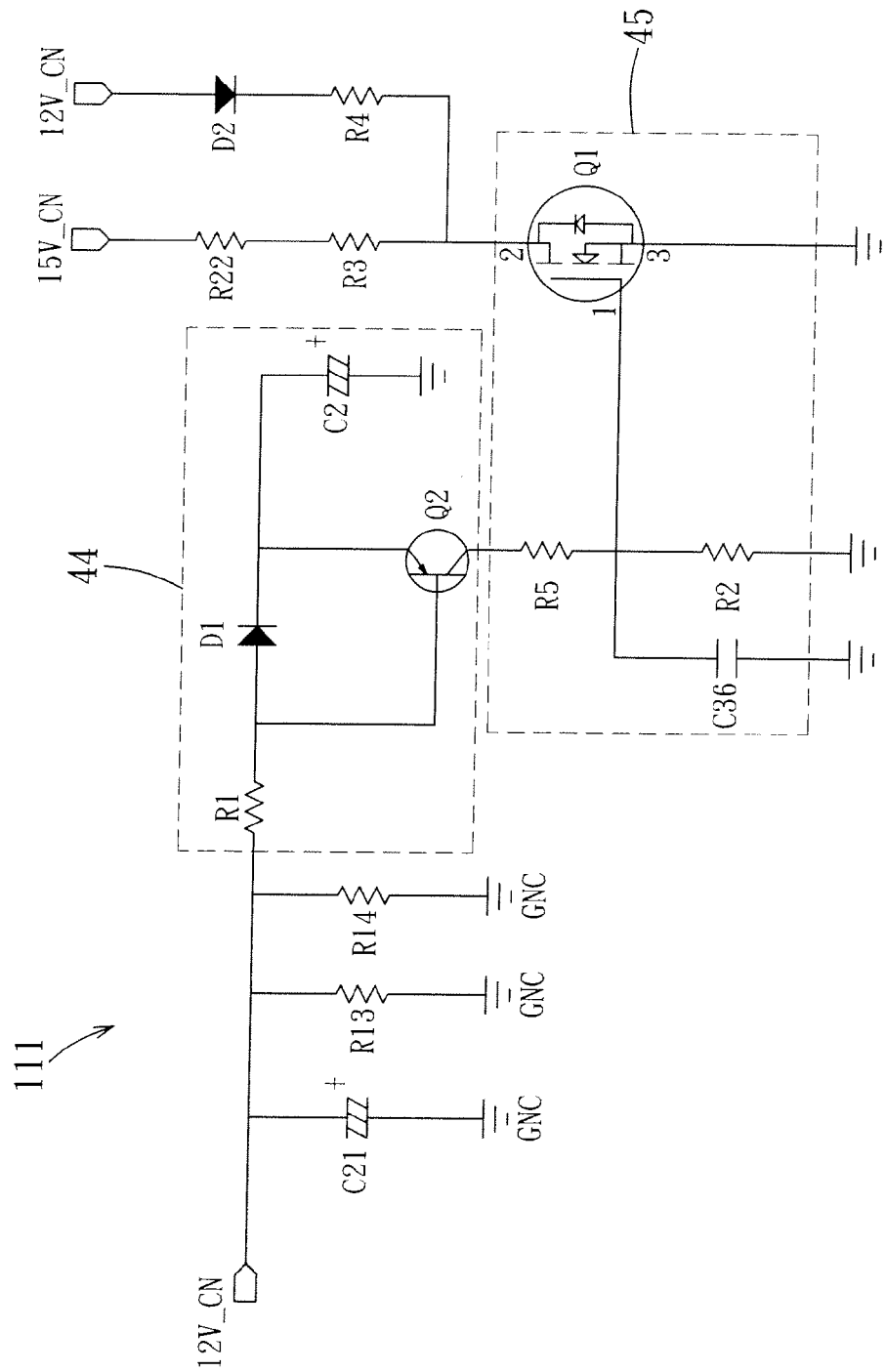
FIG. 7 is a circuit diagram of an auto discharge when AC power off module of the preferred embodiment.

Referring to FIG. 7, the auto discharge when AC power off module 111 includes a shutdown status identifying circuit 44, a discharge electronic switch 45 (for multiple inputs), and a plurality of discharge resistors. After the shutdown status identifying circuit 44 detects that the system is shut down, the discharge electronic switch 45 and the discharge resistors are used to perform discharging.

The shutdown status identifying circuit 44 includes a resistor R1, a diode D1, a capacitor C2, and a transistor Q2. After the system is started, the power of the pin 12V_CN charges the capacitor C2 through the resistor R1 and the diode D1, such that the voltage of the E gate of the transistor Q2 approaches 12V and maintains at that level. When the AC power is turned off, the voltage of the pin 12V_CN drops, the transistor Q2 is caused to conduct through the resistor R1, and the C terminal of the transistor Q2 has a high-level voltage output. At this time, the diode D1 is cut off, and the capacitor C2 can only discharge through the transistor Q2. The higher the capacitance of the capacitor C2, the longer the discharging time thereof.

The discharge electronic switch 45 includes resistors R5, R2, a capacitor C36, and a transistor Q1. The resistors R3, R22 form a discharging loop of the pin 15V_CN. The resistor R4 forms a discharging loop of the pin 12V_CN. Since the cost of a transistor is far greater than that of a diode, in order to reduce cost and simplify the circuit, the discharging electronic switch of the transistor Q1 is shared, such that an extra diode D2 is added in the discharging loop of the pin 12V_CN for use as an isolating diode to ensure that when no discharging is taking place, these discharging loops do not affect the normal operation of the voltages 15V and 12V, and at the same time, the circuit can be extended to loop discharging of 3.3V.

II. The Second Circuit 12

Figure 8:
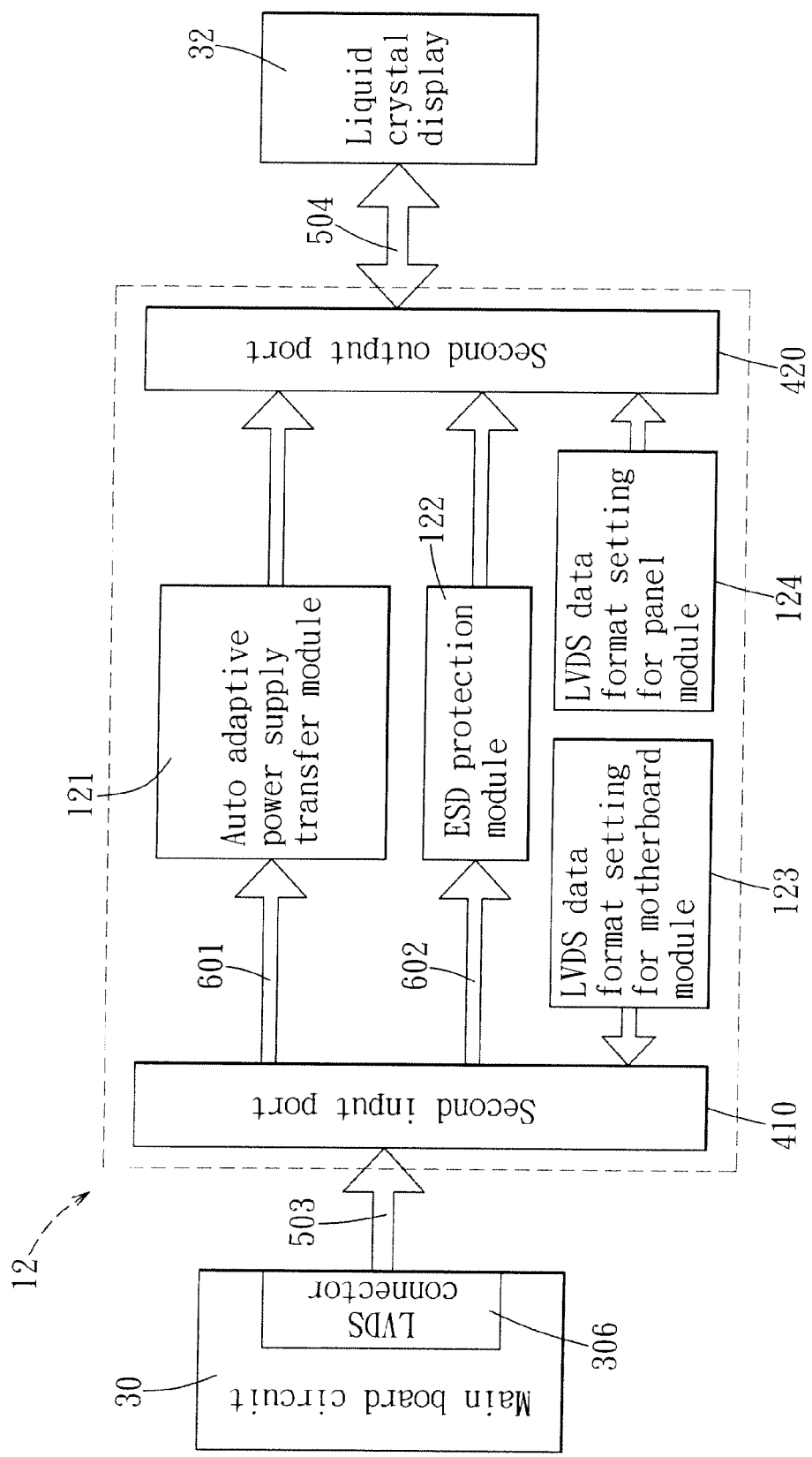
FIG. 8 is a schematic circuit block diagram of the second circuit of the preferred embodiment.

Referring to FIG. 8, the second circuit 12 functions such that the same liquid crystal display 32 can be shared when testing the main board circuits 30 of different machine models. Through the second circuit 12, the type and number of the liquid crystal displays 32 used in testing can be reduced, thereby minimizing costs associated with having to purchase different types of liquid crystal displays 32. Moreover, it is unnecessary to change the liquid crystal display 32, thereby allowing for reductions in manpower and production time. In addition, the second circuit 12 further protects the liquid crystal display 32 by reducing the testing damage rate and thereby lowers maintenance expenditures. Also, it is unnecessary to perform plugging and unplugging of the connecting wire 504 of the liquid crystal display 32 to thereby further reduce expenditures with respect to materials/parts that become worn and damaged over time.

Since the voltages of the power supply, the bit definitions of the LVDS signal pins, and the formats of the LVDS signals may not be the same for the main board circuits 30 of different liquid crystal displays, the second circuit 12 and the corresponding connecting wire 503 are needed for realization of correct signal conversion. The machine models of LCD TVs currently in production may be classified broadly into two categories as follows, depending on the resolution requirements of the liquid crystal displays 32 used for testing: WXGA (wide extend graphic array, with a resolution of 1366×768) and FHD (full high definition with a resolution of 1920×1080), in which over 80% are of the WXGA machine model type and less than 20% is of the FHD machine model type. Of course in practice, apart from the foregoing two types, the liquid crystal display TVs of other machine models may also be used for testing. In this embodiment, a liquid crystal display 32 of Model No. CMO V26B1-L01 with a WXGA resolution is used as an example. The liquid crystal display 32 requires a voltage of 5V.

The second circuit 12 includes a second input port 410, a second output port 420, an auto adaptive power supply transfer module 121, an electrostatic discharge (ESD) protection module 122, an LVDS data format setting for motherboard module 123, and an LVDS data format setting for panel module 124.

An LVDS connector 306 of the main board circuit 30 has the following two types: one is used for connection with a flexible circuit board (FFC) and the other is used for connection with twisted wires. The second input port 410 is coupled electrically to the LVDS connector 306 of the main board circuit 30 for receiving voltage signals of both 12V and 5V and a LVDS data (10 pairs LVDS data) signal. The liquid crystal display 32 uses the fixed (unchanging) connecting wire 504 for coupling electrically to the second output port 420. Due to the fixed connection of the connecting wire 504 to the second circuit 12, plugging and unplugging of the connecting wire 504 are unneeded each time the machine model of the main board circuit 30 is changed.

With regard to interface compatibility and pin bit re-assignment, in this embodiment, corresponding different designs of the connecting wires 503, 504 are used to realize the re-assignment of the power pins, the LVDS signal pins (including LVDSVDD, GND, LVDSDATA SET (or SELL-VDS), LVDSDATA (TXA0−/+, TXA3−/+, TXB0−/+, TXB3−/+), and LVDS CLOCK (TXAC−/+, TXBC−/+)), format setting pins, etc.

With respect to power supply, since the output voltages of the main board circuits 30 to be tested in this embodiment include 12V and 5V, the auto adaptive power supply transfer module 121 is needed for conversion to the voltage of 5V needed for the liquid crystal display 32.

The auto adaptive power supply transfer module 121 operates to configure a correct operating voltage to ensure that it corresponds with the regulated voltage required by the selected liquid crystal display 32 to be tested. The configurable power voltage includes 12V and 5V. In the power supply loop, if the power voltage required by the selected liquid crystal display 32 (such as Model No. CMO 26 VBL01) is 5V, and the power voltage output by the main board circuit 30 is 5V, then the auto adaptive power supply transfer module 121 automatically outputs a power of 5V directly to the liquid crystal display 32. If the power voltage output by the main board circuit 30 is 12V, then the 12V is converted to 5V through DC-to-DC conversion before being output to the liquid crystal display 32.

In another embodiment, a liquid crystal display 32 requiring a voltage of 12V may be selected. If the power voltage required by the selected liquid crystal display 32 is 12V, and an external power supply of 12V supplies power, when the main board circuit 30 starts, the power source PANEL_VCC is converted to an effective voltage level, then the power of 12V is supplied to the liquid crystal display 32 so as to ensure that the Power ON Sequence of the liquid crystal display 32 is the same as the original system design.

The manner in which the auto adaptive power supply transfer module 121 converts the voltage from the main board circuit 30 or an external voltage to a voltage of 5V or 12V required by the liquid crystal display 32 will now be described.

Figure 9:
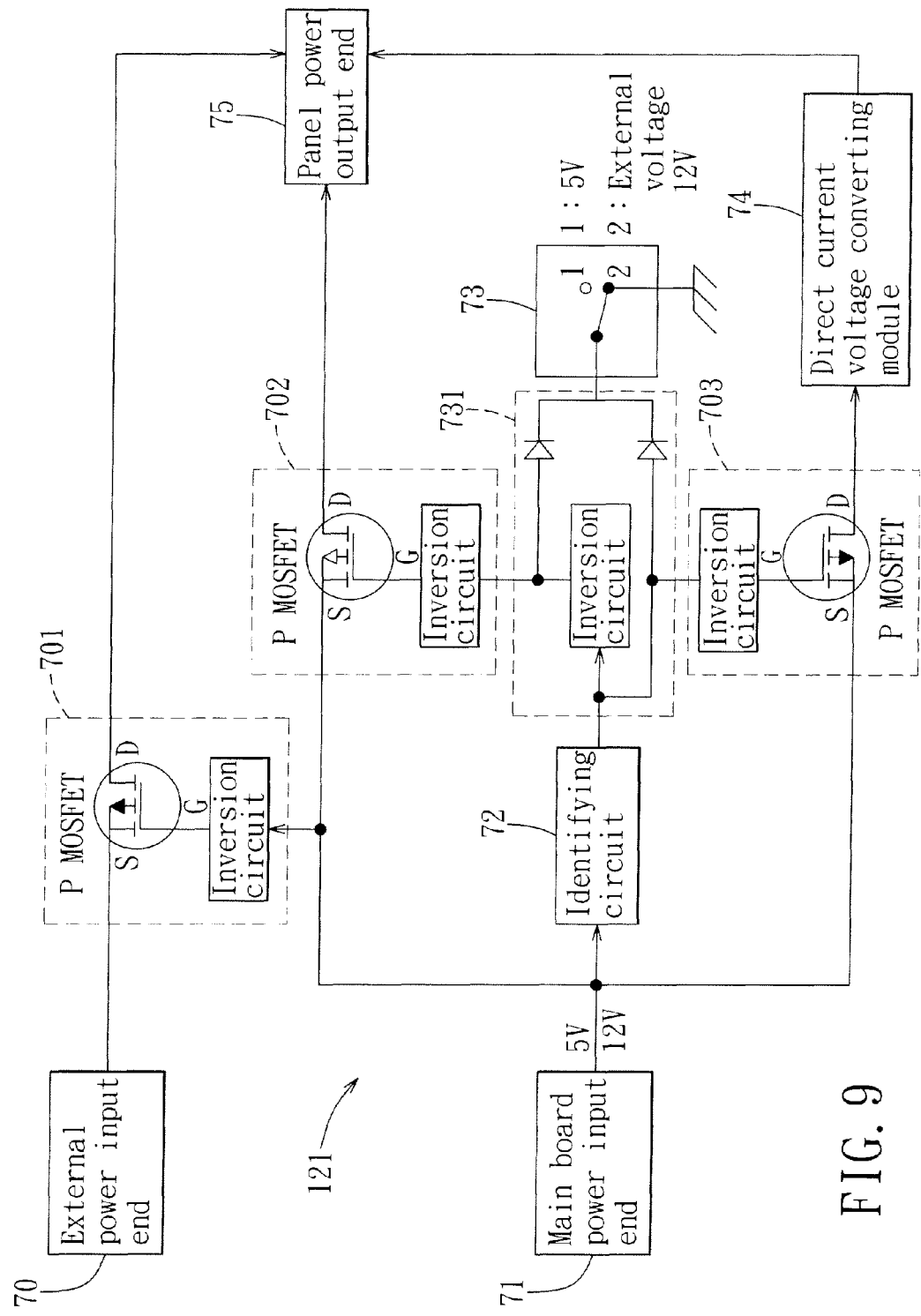
FIG. 9 is a schematic circuit block diagram of an auto adaptive power supply transfer module of the second circuit of the preferred embodiment.

Referring to FIG. 9, the auto adaptive power supply transfer module 121 includes an external power input end 70, an external switch 701, a first voltage switch 702, a second voltage switch 703, a main board power input end 71, an identifying circuit 72, a setup unit 73, a negative sequence module 731, a direct current voltage converting module 74, and a panel power output end 75. The external switch 701, the first voltage switch 702, and the second voltage switch 703 all are turned on by a high level input and turned off by a low level input.

To ensure the proper power supply timing of the power on/off of the liquid crystal display 32, the voltages output from the main board circuit 30 to the main board power input end 71 are categorized to include a first voltage of 5V and a second voltage of 12V. At this time, the setup unit 73 has to be manually operated to be disposed at a first position with an output of high resistance. In the case of a third voltage of 12V supplied externally from an external power input end 70, the setup unit 73 is manually operated to be disposed at a second position with a grounded output. These operations are described in the following.

When the main board power input end 71 supplies a voltage of 5V, the setup unit 73 is manually operated to be disposed at the first position so that the output of the setup unit 73 has a high resistance, and then outputs through the identifying circuit 72 (which automatically detects 5V or 12V) a low-level voltage, which is subsequently converted to a high-level voltage by the negative sequence module 731 and thereby turns the first voltage switch 702 on, while at the same time, the low-level voltage not converted by the negative sequence module 731 turns the second voltage switch 703 off, which results in an output of a voltage of 5V through the first voltage switch 702 to the panel power output end 75.

When the main board power input end 71 supplies a voltage of 12V, the setup unit 73 is manually operated to be disposed at the second position so as to output through the identifying circuit 72 a high-level voltage, which is subsequently converted to a low-level voltage by the negative sequence module 731 and thereby turns the first voltage switch 702 off, while at the same time, the high-level voltage not converted by the negative sequence module 731 turns the second voltage switch 703 on, which results in an output of a voltage of 5V through the direct current voltage converting module 74 to the panel power output end 75.

Furthermore, when the other external voltage power (that is, the third voltage) which is not 5V is selected from the external power input end 70, such as 3.3V or 12V, the setup unit 73 is manually operated to be disposed at the second position with a grounded output so as to turn the first voltage switch 702 and the second voltage switch 703 off while the external switch 701 is conducted. Hence, the panel power output end 75 can only acquire a needed voltage of 3.3V or 12V from the external power input end 70 through the external switch 701.

Referring again to FIG. 8, with respect to the electrostatic discharge protection module 122, since the testing system in the assembly line is easily affected by electrostatic interference from the environment or from the repeated plugging and unplugging operation of assembly line workers, and the electrostatic interference is induced from the second input port 410 of the second circuit 12, it is easy for the signal processing input end of the timing controller 321 inside the liquid crystal display 32 to be damaged. Therefore, the electrostatic discharge protection module 122 is a hot-plug circuit to shield the impact of electrostatic discharge on the liquid crystal display 32 in order to protect the same from potential damage.

Figure 10:
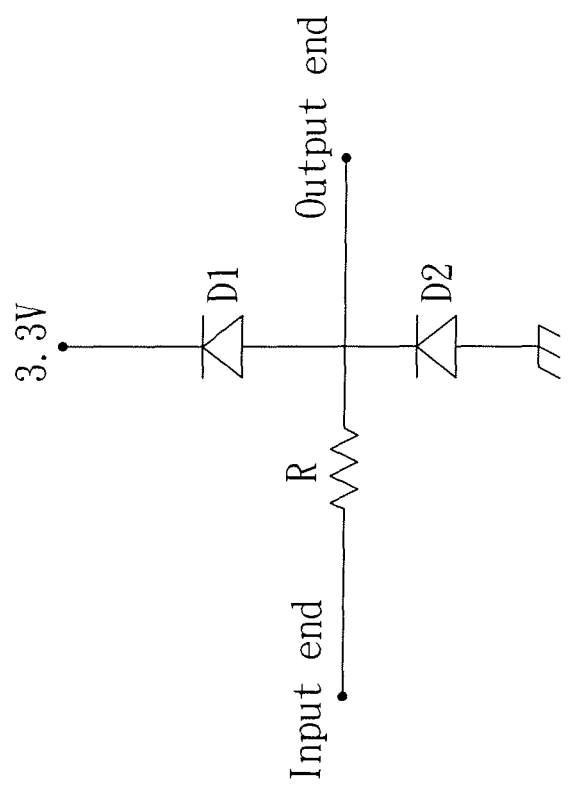
FIG. 10 is a schematic diagram for illustrating how an electrostatic discharge protection module of the second circuit protects a signal channel.

FIG. 10 is a schematic diagram for illustrating how the electrostatic discharge protection module 122 protects a signal channel. If an overly high positive pulse noise signal enters from an input end, it is first restricted by resistance, and is then pulled up by a first diode D1 to a predetermined voltage of 3.3V. If there is a peak negative pulse noise signal, it will likewise first be restricted by a resistor R, and then be pulled down by a second diode D2 to a ground voltage level so as to serve the purpose of protecting the rear-end liquid crystal display 32.

Referring again to FIG. 8, the motherboard module 123 is mainly designed for the main board circuit 30 so as to satisfy configuration requirements for different LCD TVs so that the main board circuits 30 of the LCD TVs can accurately output LVDS signals. The panel module 124 is designed for testing the liquid crystal display 32 so that the LVDS signals received by the liquid crystal display 32 can match the output signals of the main board circuits 30, such that correct screen display is ensured.

In summary, when the system 100 and the adapter 1 in which a power supply and a display device are shared to test different types of main board circuits 30 according to the present invention are used, it is not necessary to change an entire set of testing components, such that costs associated with testing the main board circuits 30 are reduced. Hence, the overall testing cost of the main board circuit 30 is minimized, and the efficiency of testing the main board circuits 30 in the assembly line is significantly increased. Hence, while maintaining the original design, various main board circuits 30 can be tested, such that the cost of the testing equipment for the factories can be reduced, the wearing out of equipment can be minimized, and production efficiency can be increased.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

What is claimed is:

1. A testing system utilizing a common power supply and a display device to test different types of a main board circuit, said testing system comprising:
a power supply device for outputting a predetermined power;
a liquid crystal display for receiving a control signal from the main board circuit to perform a testing procedure; and
an adapter including
a first circuit coupled electrically between said power supply device and the main board circuit for converting the predetermined power into a power needed by the main board circuit, and
a second circuit coupled electrically between the main board circuit and said liquid crystal display for converting a control signal generated by the main board circuit into a signal format required to perform the testing procedure on said liquid crystal display.

2. The testing system as claimed in claim 1, wherein said first circuit includes a first input port coupled electrically to said power supply device, a first output port coupled electrically to the main board circuit, and a DC-to-DC with overvoltage protect module bridging said first input port and said first output port, said first input port having a plurality of power pins, said first output port having a plurality of power pins and control pins.

3. The testing system as claimed in claim 2, wherein said first circuit further includes a first level converter and a plurality of electronic switches, input voltages of a first pin and a second pin of said first output port being generated by said electronic switches which are controlled by said first level converter which is in turn controlled by a first control pin using the power from said first input port.

4. The testing system as claimed in claim 3, wherein said first circuit further includes an auto discharge when AC power off module that has a shutdown status identifying circuit, a discharge electronic switch with multiple inputs, and a plurality of discharge resistors, said shutdown status identifying circuit performing discharging through said discharge electronic switch and said discharge resistors when detecting a testing system shutdown.

5. The testing system as claimed in claim 2, wherein said first circuit further includes a first level converter and an electronic switch, power of third and fourth pins of said first output port being obtained by said DC-to-DC with overvoltage protect module converting a predetermined voltage of said pins of said first input port into a power for supply to a third pin of said first input port, and at the same time, a voltage level of said first control pin, which has been converted by said first level converter, controls said electronic switches to generate power for said fourth pin.

6. The testing system as claimed in claim 2, wherein said first circuit further includes a second level converter that is used for converting the predetermined voltage of said first input port, and outputting one of a positive sequence voltage, an inversion voltage, and a control signal having a voltage level different from that of the predetermined voltage, the output being provided to a second control pin of said first input port.

7. The testing system as claimed in claim 1, wherein said second circuit includes a second input port coupled electrically to the main board circuit, a second output port coupled electrically to said liquid crystal display, and an electrostatic discharge protection module bridging said second input port and said second output port, said electrostatic discharge protection module including an input end for receiving an interface control signal, a first diode for pulling up an overly high positive pulse noise of the interface control signal to a predetermined voltage, and a second diode for pulling down a peak negative pulse noise of the interface control signal to a ground voltage level.

8. The testing system as claimed in claim 7, wherein said second circuit further includes an auto adaptive power supply transfer module bridging said second input port and said second output port, said auto adaptive power supply transfer module being used for setting up and outputting an operating voltage that corresponds to a regulated voltage required by said liquid crystal display.

9. The testing system as claimed in claim 1, wherein the signal format complies with a low-voltage differential signaling (LVSD) standard.

10. The testing system as claimed in claim 1, wherein said testing system is used for testing the main board circuit used by said liquid crystal display.

11. An adapter utilizing a common power supply device and a display device to test different types of a main board circuit, said adaptor comprising:
  a first circuit coupled electrically between the power supply device and the main board circuit to be tested, said first circuit including a first input port coupled electrically to the power supply device and a first output port coupled electrically to the main board circuit for converting a predetermined power generated by the power supply device into a power needed by the main board circuit; and
  a second circuit coupled electrically between the main board circuit and the display device, said second circuit including a second input port coupled electrically to the main board circuit and a second output port coupled electrically to the display device for converting a control signal generated by the main board circuit into a signal format required to perform the testing procedure on the display device.

12. The adaptor as claimed in claim 11, wherein said first circuit further includes a DC-to-DC with overvoltage protect module bridging said first input port and said first output port, said DC-to-DC with overvoltage protect module including a DC-to-DC conversion portion and an overvoltage protection portion, said DC-to-DC conversion portion converting a first voltage loaded by said first input port into a second voltage to be used by a microprocessor of the main board circuit, said overvoltage protection portion being used for automatically disconnecting the power supply of the second voltage to render the output of the second voltage to be 0 volts when the second voltage is higher than a predetermined voltage.

13. The adaptor as claimed in claim 11, wherein said first circuit further includes a first level converter and a plurality of electronic switches interposed between said first input port and said first output port, said first output port having a first control pin for generating a system on voltage level, said first level converter being used to convert the system on voltage level of said first control pin and controlling the on and off states of said electronic switches to output the converted voltage level to said first output port.

14. The adaptor as claimed in claim 11, wherein said first circuit further includes an auto discharge when AC power off module that has a shutdown status identifying circuit, a discharge electronic switch with multiple inputs, and an a plurality of discharge resistors, said shutdown status identifying circuit performing discharging through said discharge electronic switch and said discharge resistors when detecting a testing system shutdown.

15. The adaptor as claimed in claim 11, wherein said first circuit further includes a second level converter that is used for converting the predetermined voltage of said first input port, and outputting one of a positive sequence voltage, an inversion voltage, and a control signal having a voltage level different from that of the predetermined voltage, the output being provided to a second control pin of said first output port.

16. The adaptor as claimed in claim 11, wherein said second circuit further includes an electrostatic discharge protection module bridging said second input port and said second output port, said electrostatic discharge protection module including an input end for receiving an interface control signal, a first diode for pulling up an overly high positive pulse noise of the interface control signal to a predetermined voltage, and a second diode for pulling down a peak negative pulse noise of the interface control signal to a ground voltage level.

17. The adaptor as claimed in claim 11, wherein said second circuit further includes an auto adaptive power supply transfer module bridging said second input port and said second output port, said auto adaptive power supply transfer module being used for setting up and outputting an operating voltage that corresponds to a regulated voltage required by the display device.

18. An adapter utilizing a common power supply device and a display device to test different types of a main board circuit, an output voltage of the main board circuit being a first voltage or a second voltage, the display device requiring the first voltage, said adaptor comprising:
  a second input port coupled electrically to the main board circuit;
  a second output port coupled electrically to the display device; and
  an auto adaptive power supply transfer module including
    a main board power input end for receiving one of the first voltage and the second voltage from said second input port,
    an identifying circuit for outputting a low-level voltage when detecting the first voltage, and outputting a high-level voltage when detecting the second voltage,
    a panel power output end coupled electrically to said second output port,
    a negative sequence module for converting the high-level voltage and the low-level voltage to a low-level voltage and a high-level voltage, respectively,
    a first voltage switch coupled electrically to said identifying circuit, said negative sequence module, and said panel power output end for switching on when receiving a high-level voltage and switching off when receiving a low-level voltage,
    a direct current voltage converting module coupled electrically between said main board power input end and said panel power output end,
    a second voltage switch coupled electrically between said identifying circuit and said direct current voltage converting module for switching on when receiving a high-level voltage and for switching off when receiving a low-level voltage, and
    a setup unit disposed between said first voltage switch and said second voltage switch, such that, when said setup unit is disposed in a first position for outputting a high resistance, said main board power input end is controlled to provide the first voltage and to convert and output a low-level voltage through said identifying circuit for subsequent conversion to a high-level voltage through said negative sequence module, and a low-level voltage not passed through said negative sequence module turns off the second voltage switch, and when said setup unit is disposed in a second position for a grounded output, said main board power input end is controlled to provide the second voltage and to convert and output a high-level voltage through said identifying circuit for subsequent conversion to a low-level voltage through said negative sequence module, and a high-level voltage not passed through said negative sequence module turns on the second voltage switch and is subsequently output to said panel power output end.

19. The adaptor as claimed in claim 18, wherein said auto adaptive power supply transfer module further includes:
an external power input end coupled electrically to said second input port for receiving a third voltage; and
an external switch coupled electrically among said external power input end, said main board power input end, and said panel power output end to be turned on when receiving a high-level voltage and to be turned off when receiving a low-level voltage;
wherein, when said setup unit is disposed in the second position with a grounded output, said first voltage switch and said second voltage switch are both turned off and said external switch is turned on.

* * * * *